United States Patent [19]

Hyatt, Jr.

[11] Patent Number: 5,086,557

[45] Date of Patent: Feb. 11, 1992

[54] METHOD OF ASSEMBLING ELECTRONIC COMPONENT SYSTEMS

[75] Inventor: Richard G. Hyatt, Jr., Salem, Va.

[73] Assignee: Medeco Security Locks, Inc., Salem, Va.

[21] Appl. No.: 580,460

[22] Filed: Sep. 11, 1990

[51] Int. Cl.$^5$ .............................................. H05K 3/30
[52] U.S. Cl. ........................................ 29/832; 29/833; 29/834; 361/414; 428/901
[58] Field of Search ................. 29/877, 884, 833, 834, 29/830, 720, 721, 832; 428/901; 361/414

[56] References Cited

U.S. PATENT DOCUMENTS

| | | | |
|---|---|---|---|
| 3,266,162 | 8/1966 | Burke | 29/833 X |
| 3,831,250 | 8/1974 | Holiday | 29/833 X |
| 3,992,772 | 11/1976 | Scannell et al. | 29/833 |
| 4,916,807 | 4/1990 | Wiese | 361/414 X |

FOREIGN PATENT DOCUMENTS

| | | | |
|---|---|---|---|
| 2728067 | 1/1979 | Fed. Rep. of Germany | 29/720 |
| 143845 | 9/1980 | Fed. Rep. of Germany | 29/833 |
| 3602416 | 7/1987 | Fed. Rep. of Germany | 29/833 |
| 738210 | 6/1980 | U.S.S.R. | 29/833 |

Primary Examiner—Carl J. Arbes
Attorney, Agent, or Firm—Rothwell, Figg, Ernst & Kurz

[57] ABSTRACT

A method for installing and assembling electronic circuit board component systems utilizes templates having installation instructions and conductor terminal markings printed thereon, which are temporarily mounted onto the circuit boards during wire connection assembly. In one embodiment, the circuit boards are advantageously configured with semiconductor logic and memory components on a separate board from hard wired and power supply components, which are less susceptible to failure.

7 Claims, 6 Drawing Sheets

METHOD OF ASSEMBLING ELECTRONIC COMPONENT SYSTEMS

BACKGROUND OF THE INVENTION

1. Field of the Invention

This invention relates generally to methods of assembling and installing electronic component systems, and more particularly, to methods of assembling and installing electronic systems comprised of one or more separate printed circuit boards.

2. Background and Prior Art

Electronic circuit board systems, containing both semiconductor memory and logic as well as hard wired components such as power supply related components, switches, interface units, etc., are present in virtually every area of present day technology, from communications to consumer electronic goods, automobiles and other transport vehicles and personal computing systems.

Typically, the servicing and installation of such systems are complicated tasks requiring the use of extensive installation and repair manuals. Because of the large number of wiring connections which exists, such printed circuit board systems are susceptible to errors in installation and repair.

Conventional printed circuit systems further include on a single board components such as fuses, power converters, relays, and interface components which are hard wired into the system and which are not prone to failure, in combination with semiconductor memory and logic components such as RAM, ROM, and microprocessor components which can be easily damaged and which must be replaced.

If a single semiconductor logic component on a circuit board becomes damaged, frequently it is necessary for the entire board to be replaced because of the prohibitive time and cost involved in replacing the damaged semiconductor component. Thus, the failure of a relatively inexpensive semiconductor component may necessitate that an entire circuit board be replaced, including more costly hard wired components such as power supplies and interface units.

SUMMARY OF THE INVENTION

The present invention overcomes the problems noted above, eliminating the need for an installer to refer to an installation manual, significantly reducing the time required to install and assemble an electronic circuit board system, reducing or substantially eliminating errors in circuit board installation, and allowing fast and convenient removal and replacement of semiconductor memory and logic components.

The present invention achieves these advantages by providing a method of assembling an electronic component system comprising the steps of temporarily mounting a first template having installation instructions printed thereon onto a circuit board containing at least one conductor terminal, interconnecting the components of the electronic system according to the installation instructions printed on the template, and removing the template from the circuit board.

The present invention further provides a method in which the template is shaped and sized to snap fit onto the circuit board, in which a number of different templates having progressive installation instructions are sequentially removed and mounted onto the circuit board during the installation process.

In a preferred embodiment, the templates further include markings which identify terminals on the circuit board for wire connections to be made.

BRIEF DESCRIPTION OF THE DRAWINGS

The present invention will become more fully understood from the detailed description given hereinbelow and the accompanying drawings which are given by way of illustration only, and are not limitative of the present invention, and wherein.

DETAILED DESCRIPTION OF THE PREFERRED EMBODIMENTS

Figure 1:
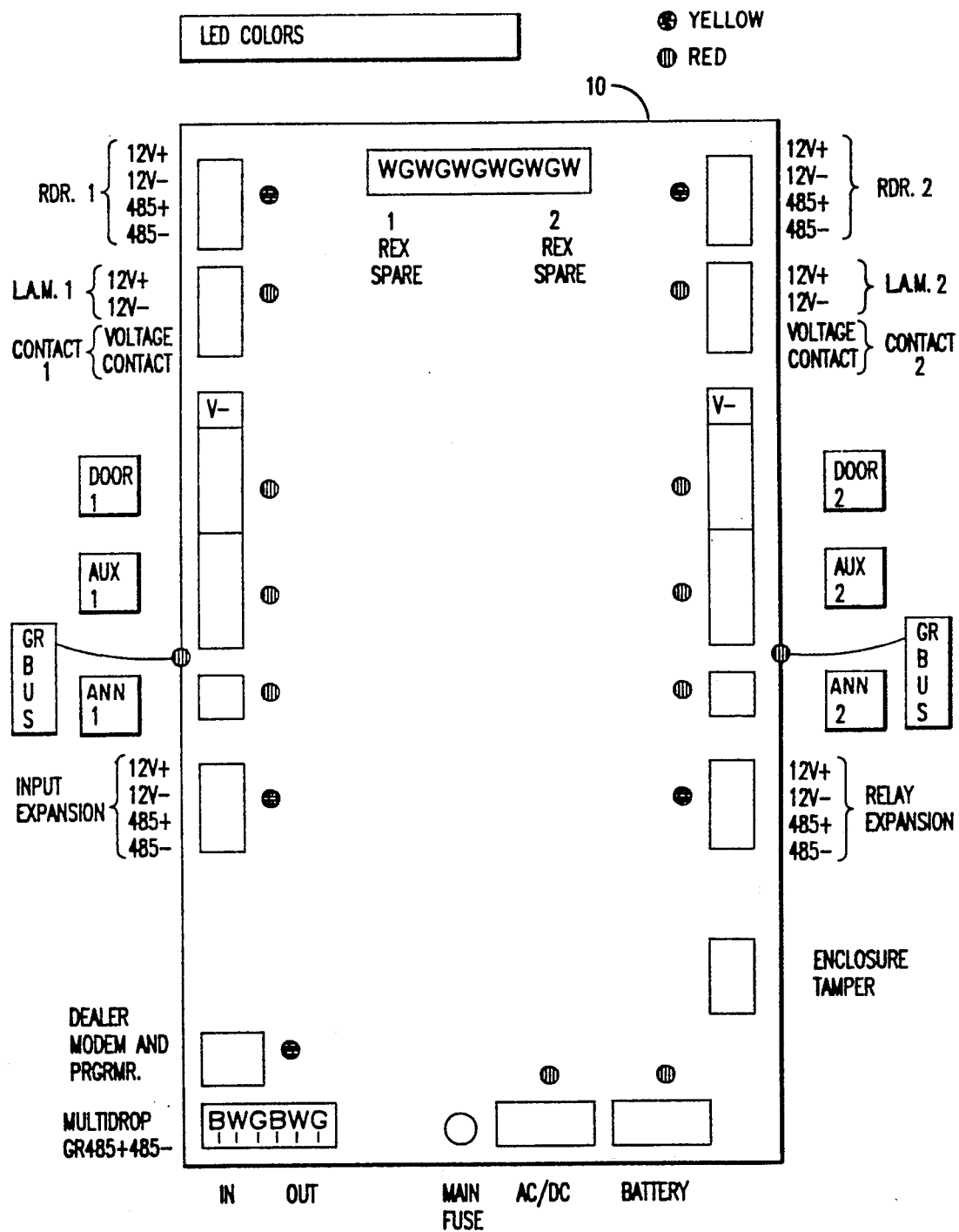
FIG. 1 is a schematic diagram of a basic circuit board according to the present invention.
Figure 2:
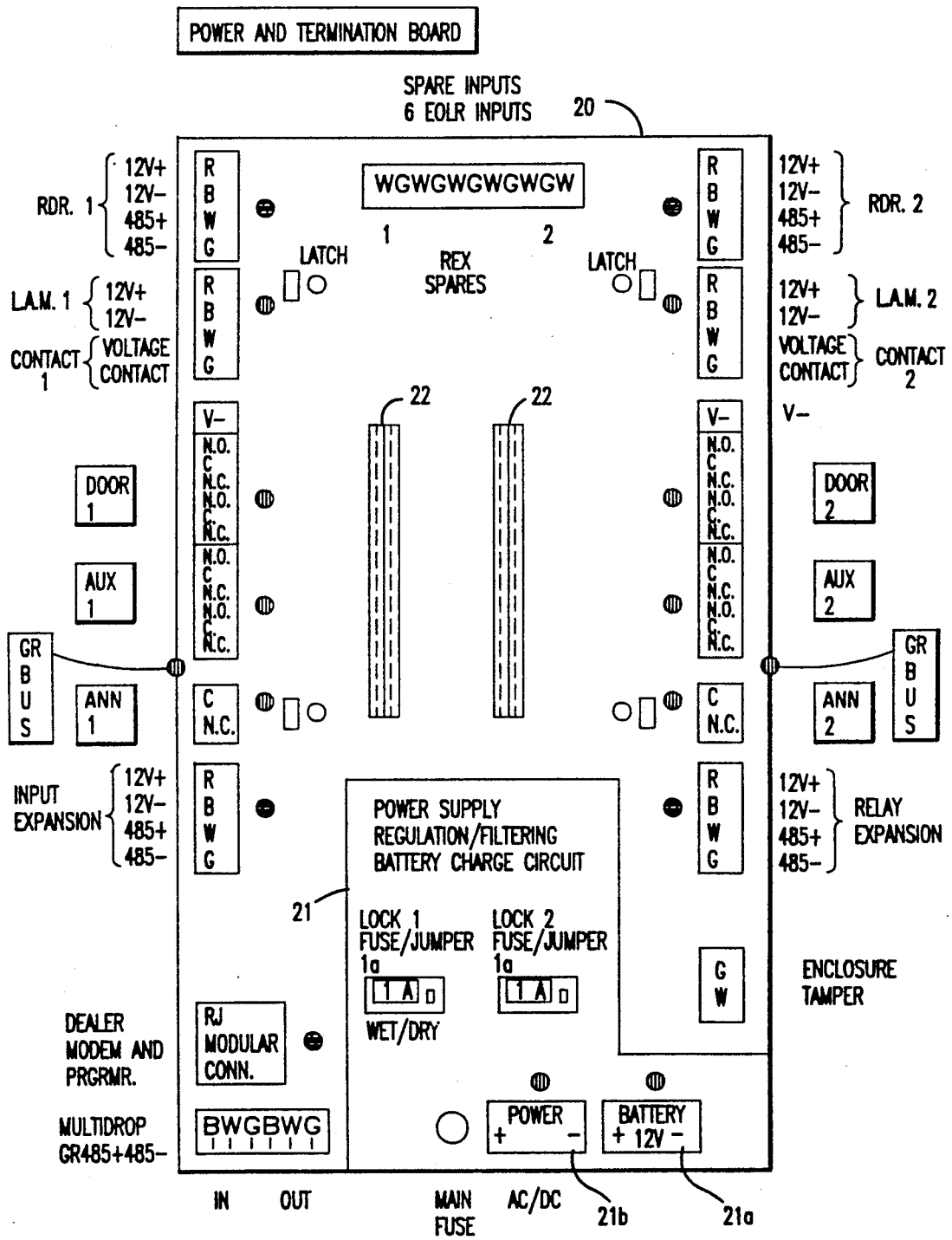
FIG. 2 is a schematic diagram of a power supply and regulation circuit board according to the present invention.
Figure 3:
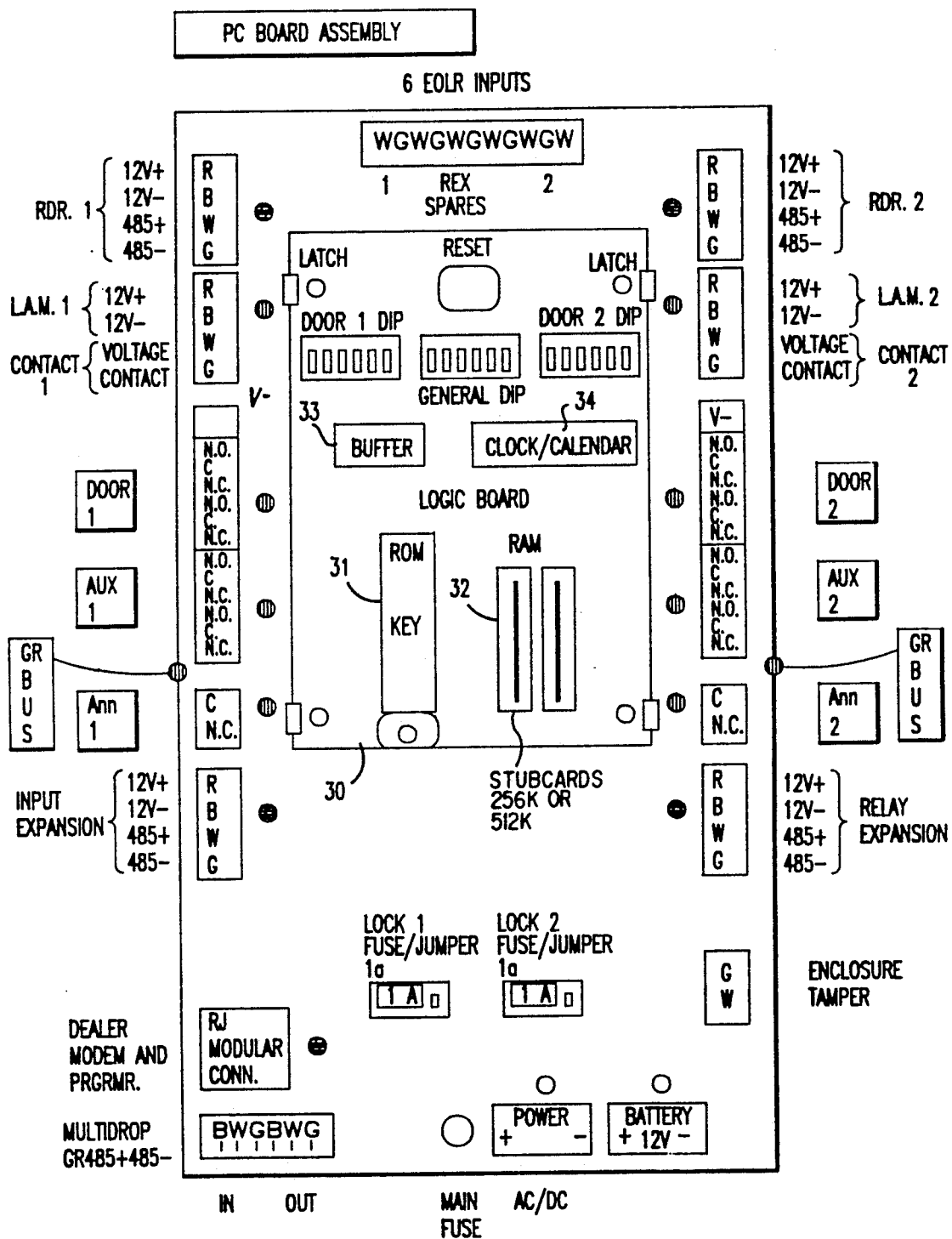
FIG. 3 is a schematic diagram of a semiconductor logic and memory circuit board of an electronic component system according to one preferred embodiment of the present invention.

FIGS. 1, 2 and 3 are schematic views of a plurality of printed circuit boards for an electronic system according to the present invention. For purposes of illustration and explanation, the circuit boards shown are part of an electronic security system in which an electronic key containing an identification code is inserted into a key reader device adjacent a locked door.

FIG. 1 illustrates a basic PC board having a plurality of input terminals. In particular, terminals RDR.1 and RDR.2 are terminals for the connection of first and second electronic key readers, terminals LAM1, contact 1 and LAM2, contact 2 are terminals for sensing the position of doors, door 1, door 2, are terminals connected to lock actuation relay switches, terminals AUX1, AUX2 are auxiliary terminals, terminals ANN1, ANN2 are connectable to alarm devices, and terminals "input expansion" and "relay expansion" are terminals connectable to interface units for future modification of the system. Also on this circuit board are terminals for a battery power supply, an AC/DC converter, a main fuse, a multi-drop multiplex interface terminals, and a terminal for a modem and programmer.

FIG. 2 illustrates a second PC board 20 containing a power supply section 21 in which battery 21a and AC/DC converter 21b are connected to the battery and AC/DC connector terminals of FIG. 1, and also includes logic connector terminals 22 for the connection of logic and memory circuits to the power supply and input/output terminals. PC board 20 further contains terminal connectors which are coupled to the corresponding terminal of PC board 10 of FIG. 1.

FIG. 3 illustrates a PC board 30 containing various logic and memory components such as ROM 31, RAM 32, buffer memory 33, clock 34 and a microprocessor, not shown. Board 30 is connected to the power supply through connector terminals 22 and is also connected to various input/output terminals and interfaces on board 20.

ROM 31 can be constituted by an easily removable and replaceable keylike device, such as disclosed in U.S. Pat. No. 4,578,573. In the event of ROM or RAM failure, the ROM and RAM devices may be easily removed and replaced, or alternatively the PC board 30 may be removed and replaced, without the necessity of replacing the components located on PC boards 10 and 20.

Figures 4A, 4B:
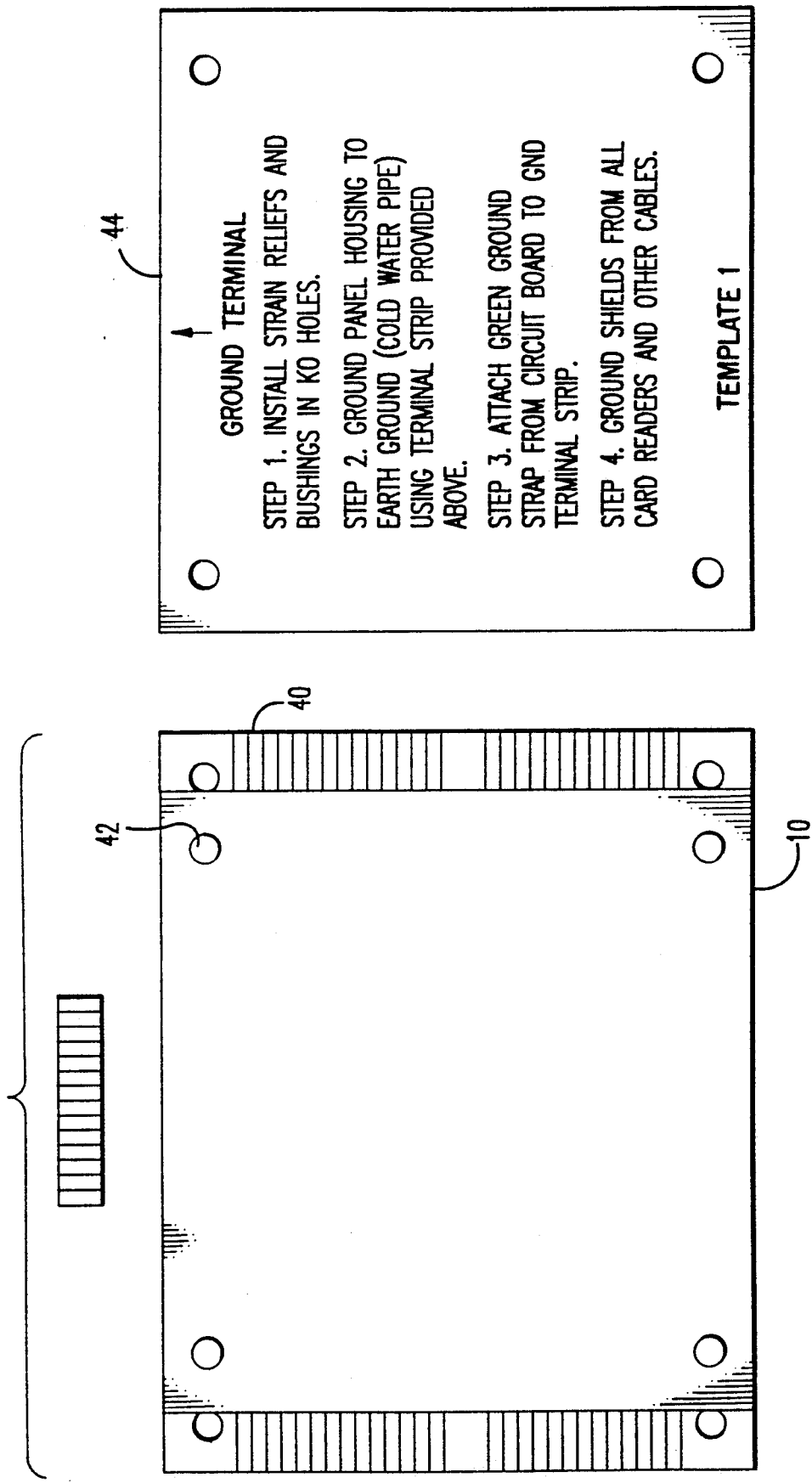
FIGS. 4A-4D are plan views of a circuit board and installation templates for mounting onto the circuit board.
Figure 4D:
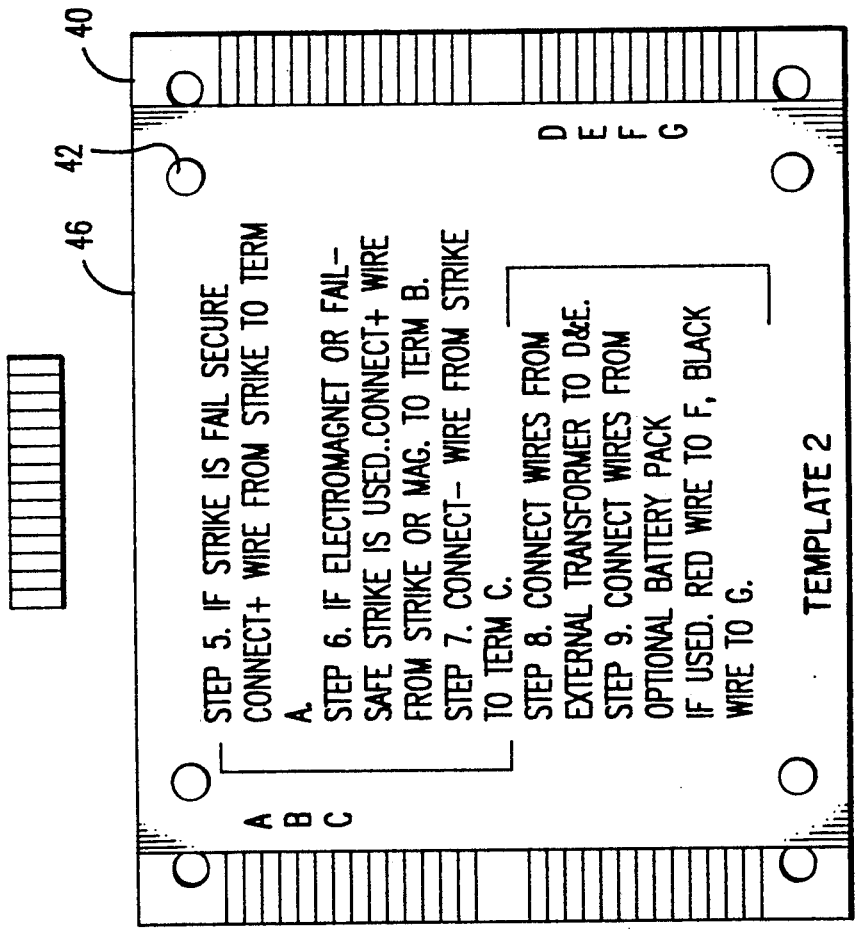
Figure 4C:
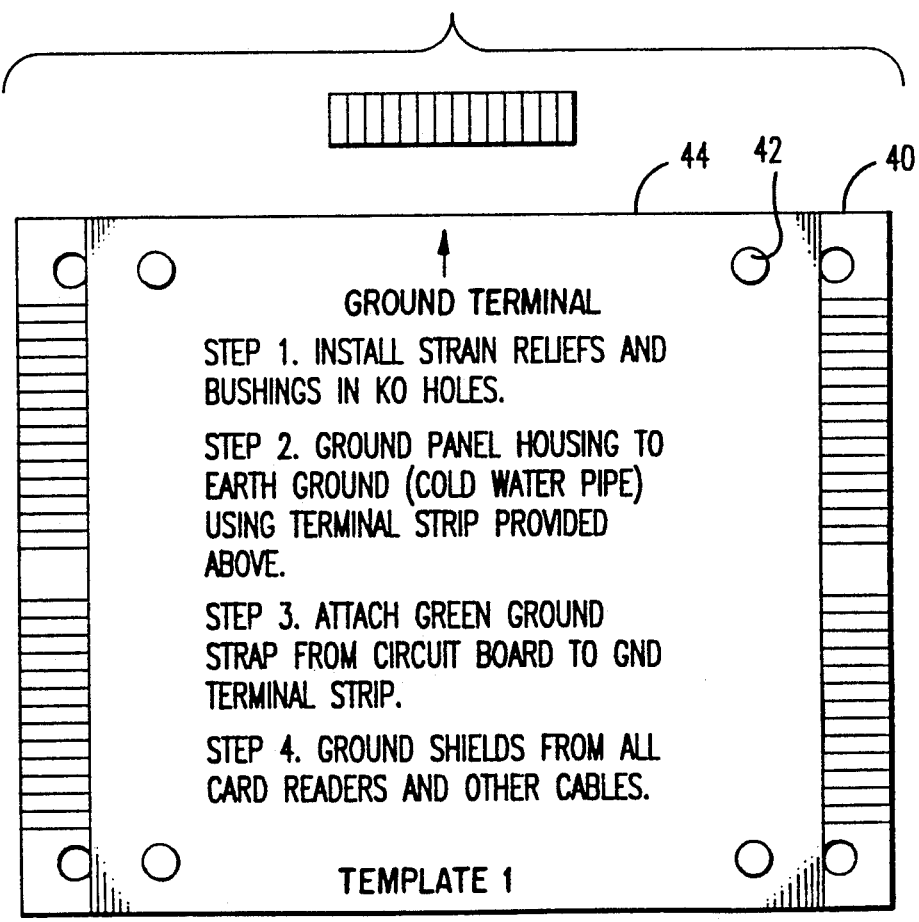

FIG. 4A illustrates lower power supply and wire termination circuit board 10 mounted on circuit board housing 40, which also contains a plurality of mounting posts 42 for the upper PC boards. FIG. 4B illustrates an example template 44 having step-by-step installation instructions and terminal markings printed thereon which is temporarily mounted on the PC board mounting posts 42 as shown in FIG. 4C. FIG. 4D illustrates a second template 46 having further instructions and terminal markings which is mounted on mounting posts 42 after all of the installation steps of template 44 have been executed.

In operation, the PC board is mounted on the posts 42 and the first template 44 is placed over the PC board. The installer then follows the numbered instructions on the template, advantageously utilizing the markings which point out the various terminals to which connections are to be made. Once all of the steps of the first template have been executed, the next template 46 is exchanged with the first template and the next installation steps are followed.

Figure 5:
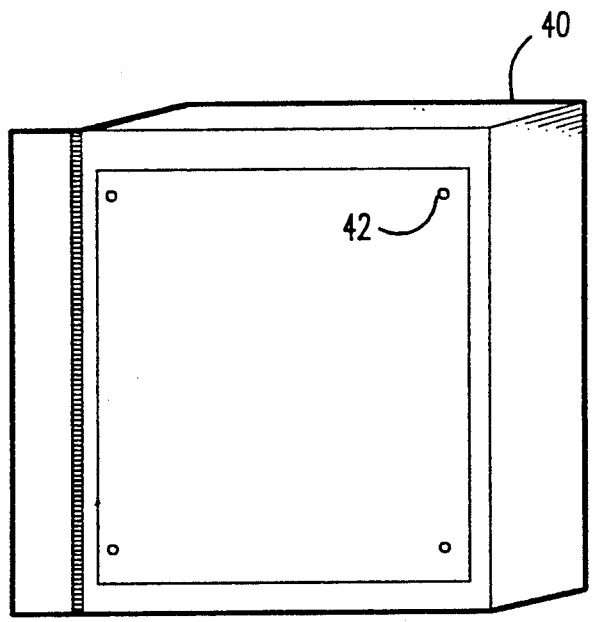
FIG. 5 is a perspective view of a system housing unit in which the various circuit boards are installed.

FIG. 5 is a perspective view of the housing 40 and mounting posts 42 in which the PC board system is installed.

Although the method of the present invention has been described in the environment of a plurality of separate circuit boards, it is not limited to such a configuration but is equally applicable to the installation of a single PC board system.

The invention being thus described, it will be apparent to those skilled in the art that the same may be varied in many ways without departing from the spirit and scope of the invention. Any and all such modifications are intended to be included within the scope of the following claims.

I claim:

1. A method of assembling an electronic component system comprising the steps of:

temporarily mounting a first template having installation instructions printed thereon onto a circuit board containing at least one wire conductor terminal;

interconnecting components of the circuit board with the remainder of the electronic system through said at least one wire conductor terminal according to the installation instructions printed on said template; and removing said template from said circuit board.

2. The method of claim 1, wherein said template is shaped and sized to snap fit onto said circuit board.

3. The method of claim 1, further comprising the step of temporarily mounting a second template having installation instructions printed thereon onto said circuit board for interconnecting electronic system components after executing the instructions on and removing said first template.

4. The method of claim 1, wherein said circuit board includes a plurality of wire conductor terminals and said template further includes markings for identifying terminals on said circuit board.

5. The method of claim 3, wherein said circuit board includes a plurality of wire conductor terminals and said second template further includes markings for identifying terminals on said circuit board.

6. The method of claim 1, wherein said template contains step-by-step instructions for the assembly of said component system.

7. A method of assembling an electronic component system comprising the steps of:

temporarily mounting a first template having installation instructions printed thereon onto a circuit board containing at least one wire conductor terminal;

interconnecting components of the electronic system according to the installation instructions printed on said template; and removing said template from aid circuit board;

wherein said electronic component system is comprised of a plurality of circuit boards, said step of interconnecting comprising the step of interconnecting circuit boards to each other, and wherein power supply and hardwired circuit components are mounted on circuit boards separate from circuit boards containing semiconductor logic and memory components.

* * * * *